US010595444B1

(12) United States Patent
Tsai et al.

(10) Patent No.: US 10,595,444 B1
(45) Date of Patent: Mar. 17, 2020

(54) ROTATABLE BOARD CONFIGURATION TO IMPROVE COOLING

(71) Applicant: QUANTA COMPUTER INC., Taoyuan (TW)

(72) Inventors: Chiao-Lun Tsai, Taoyuan (TW); Hsin-Chieh Lin, Taoyuan (TW); Che-Wei Hsu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/124,345

(22) Filed: Sep. 7, 2018

(51) Int. Cl.
*H05K 7/20* (2006.01)
*H05K 7/14* (2006.01)
*H01R 12/73* (2011.01)

(52) U.S. Cl.
CPC ....... *H05K 7/20736* (2013.01); *H01R 12/737* (2013.01); *H05K 7/1489* (2013.01); *H05K 7/1492* (2013.01)

(58) Field of Classification Search
CPC .......... H05K 7/20563; H05K 7/20727; H05K 7/1489; H05K 7/1492; G06F 1/20; H01R 12/737
USPC ........ 361/679.46–679.54, 688–723; 454/184
See application file for complete search history.

(56) References Cited

U.S. PATENT DOCUMENTS

| | | | |
|---|---|---|---|
| 8,199,501 B2 | 6/2012 | Sawai et al. | |
| 9,870,333 B1 | 1/2018 | Lam et al. | |
| 10,356,934 B2* | 7/2019 | Ni | G06F 1/184 |
| 2014/0211410 A1* | 7/2014 | Cary | G06F 1/20 361/679.46 |
| 2016/0147628 A1* | 5/2016 | Arroyo | G06F 11/2247 714/43 |
| 2016/0154765 A1 | 6/2016 | Shin | |
| 2017/0262029 A1* | 9/2017 | Nelson | G06F 1/20 |
| 2017/0322899 A1* | 11/2017 | Ni | G06F 12/0246 |

FOREIGN PATENT DOCUMENTS

| | | |
|---|---|---|
| CN | 104657317 B | 12/2017 |
| TW | I394525 B1 | 4/2013 |
| TW | I631470 B | 8/2018 |

OTHER PUBLICATIONS

TW Office Action for Application No. 107144381, dated May 15, 2019, w/ First Office Action Summary.
TW Search Report for Application No. 107144381, dated May 15, 2019, w/ First Office Action.
Extended European Search Report for EP Application No. 19162172.1, dated Oct. 10, 2019.

* cited by examiner

*Primary Examiner* — Zachary Pape
(74) *Attorney, Agent, or Firm* — Nixon Peabody LLP; Zhou Lu (57) ABSTRACT

A computing device for cooling an electronic component is provided. The computing device includes a chassis with a first end and a second end; fan modules located at the first end of the chassis; and a Peripheral Component Interconnect Express (PCIe) baseboard located at a front side of the chassis. The PCIe baseboard is configured to support placement thereof in the chassis in a first position and a second position. The second position of the PCIe baseboard is a 180-degree rotation from the first position. The PCIe baseboard includes GPU slots for installing a plurality of graphic processing units (GPUs), the GPUs including fan modules.

21 Claims, 12 Drawing Sheets

ROTATABLE BOARD CONFIGURATION TO IMPROVE COOLING

FIELD OF THE INVENTION

The present invention relates to systems and methods for dissipating heat that emanates from individual electronic units within a computing device.

BACKGROUND

An electronics rack, such as a server rack, can have dozens of electronic units operating, each of which is generating heat that must be removed from the electronics rack. The failure to remove this heat can result in accelerated aging and/or premature failure of the electronic units or other components in the electronics rack. However, in some types of computing devices, the removal of heat can be challenging, for example, as in the prior art computing device shown in FIG. 1.

Figure 1:
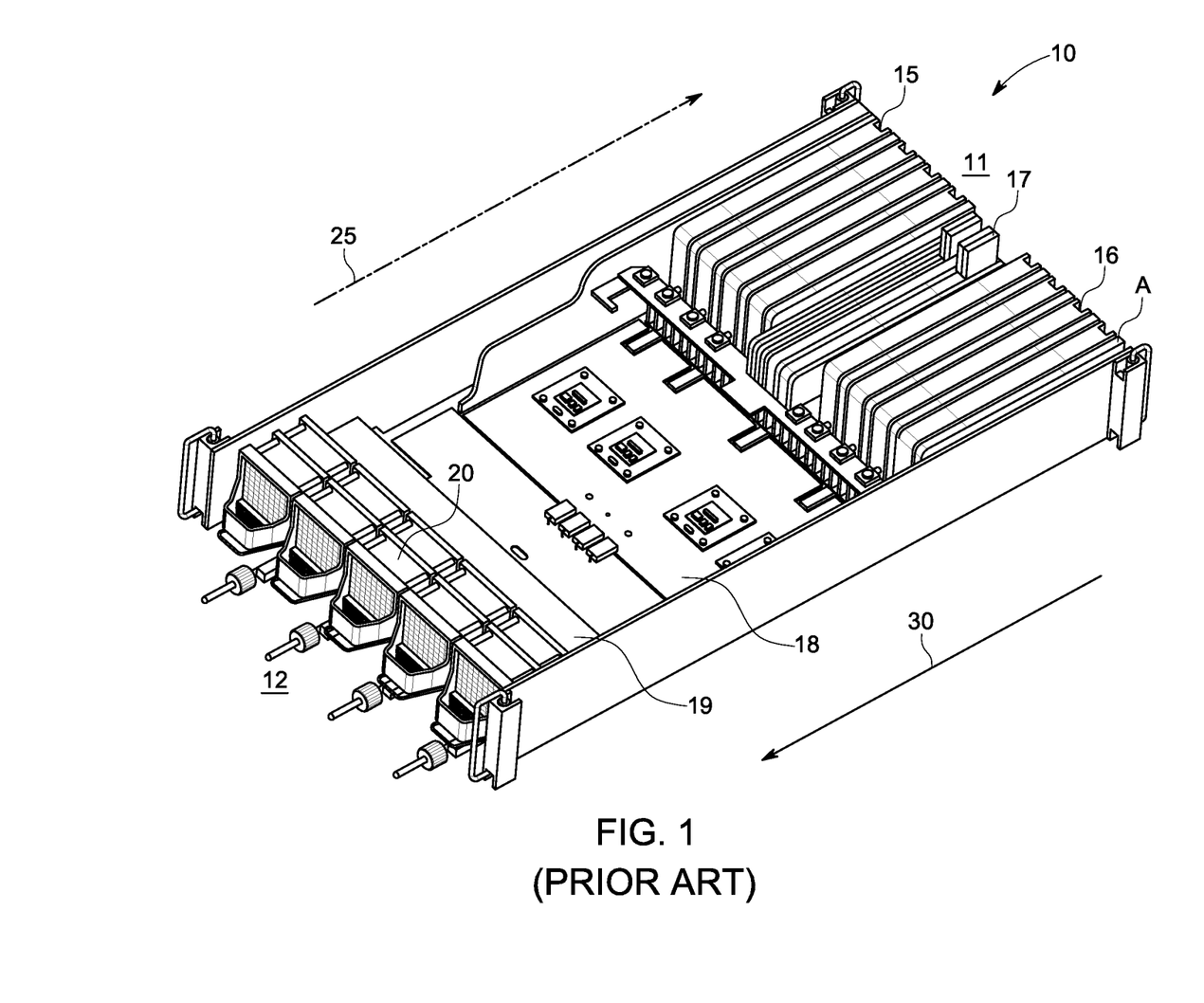
FIG. 1 is a perspective view of a conventional graphics processing unit (GPU) system.

FIG. 1 is a perspective view of a conventional graphics processing unit (GPU) system 10 for installation in an electronics rack. The GPU system 10 has a front side 11 and a rear side 12. The GPU system 10 also includes a first set of GPU modules 15 and a second set of GPU modules 16, each with GPU fans (not shown) and separated by PCIe card slots 17 installed in PCIe slots (not shown) in the GPU system 10. Two network cards are present at the PCIe slots 17. In FIG. 1, the PCIe card slots 17 are network cards. The GPU system 10 further includes a PCIe baseboard 18 and a power distribution board (PDB) 19. The first and second sets of GPU modules 15 and 16 are located at the front side 11 of the GPU system 10. The GPU system 10 also includes fan modules 20 located opposite of the first and second sets of GPU modules 15 and 16, i.e., at a rear side 12 of the GPU system 10.

In system 10, the fan module 20 provides airflow 30 across the PCIe card slots 17. However, the desktop GPU (group 15 and group 16) include an attached fan. The attached fan produces airflow 25. Airflow 25 is in conflict with airflow 30 of the system fan. Because the airflow 25 of the GPU system 10 is in direct conflict with the system airflow 30, it will negatively impact the cooling performance of the fan modules 20.

Some possible solutions to the conflicting airflow includes disabling the GPU fans, installing the GPU system 10 in reverse, or developing a PCIe baseboard separate from the PCIe baseboard 18. However, these proposed solutions would require significant redesign of many components in the GPU system 10; introduce additional complexity into the maintenance of the GPU system 10; and/or would compromise the integrity of the component of the GPU system 10. Therefore, there is a need to provide a cooling system in an electronics rack that facilitates high-heat removal without requiring significant redesign of components in a GPU system, or increasing the complexity in operating or maintaining the GPU system.

SUMMARY

Embodiments of the disclosure concern a computing device for cooling an electronic component. The computing device includes a chassis with a first end and a second end; fan modules located at the first end of the chassis; and a Peripheral Component Interconnect Express (PCIe) baseboard located at a front side of the chassis. The PCIe baseboard is configured to support placement thereof in the chassis in a first position and a second position. The second position of the PCIe baseboard is a 180-degree rotation from the first position. The PCIe baseboard includes GPU slots for installing a plurality of graphic processing units (GPUs), which include fan modules.

The computing device can also include a power distribution board (PDB) housed between the fan modules and the PCIe baseboard. The computing device can also include power cable connectors connecting the PDB with the fan modules, the first and second set of graphic processing units, and the at least one PCIe slot. In some embodiments of the disclosure, the power cable connectors can be routed towards a center line of the PCIe baseboard, or along outer edges of the PCIe baseboard.

The PCIe baseboard can be configured to rotate 180 degrees between the first position and the second position. In some embodiments of the disclosure, two PCIe slots can be connected to the PCIe switch via a MUX switch, a switched-capacitor resistor circuit, or a SlimSAS connector. In some embodiments of the disclosure, the first position of the PCIe baseboard is a server GPU configuration. In the server GPU configuration, the PCIe switch is located between the first and second set of graphic processing units and the fan modules.

In some embodiments of the disclosure, the second position of the PCIe baseboard is a desktop GPU configuration. In the desktop GPU configuration, the PCIe switch can be located at the front side. The computing device can also include PCIe signal cables connecting the PCIe slot to the PCIe switch. The PCIe signal cables can be shorter in the second position of the PCIe baseboard than the first position of the PCIe baseboard, thereby improving signal integrity. The PCIe baseboard can include screw mounting holes symmetrically positioned on the PCIe baseboard to enable a transition between the first position and the second position.

Embodiments of the disclosure also concern a PCIe baseboard located at a front side of a chassis. The PCIe baseboard is configured to support placement thereof in the chassis in a first position and a second position. The second position of the PCIe baseboard is a 180-degree rotation from the first position. The PCIe baseboard includes GPU slots for installing graphic processing units (GPUs). The GPUs each include a fan module.

Additional features and advantages of the disclosure will be set forth in the description that follows, and in part, will be obvious from the description; or can be learned by practice of the principles disclosed herein. The features and advantages of the disclosure can be realized and obtained by means of the instruments and combinations particularly pointed out in the appended claims. These and other features of the disclosure will become fully apparent from the following description and appended claims, or can be learned by the practice of the principles set forth herein.

BRIEF DESCRIPTION OF THE DRAWINGS

In order to describe the manner in which the above-recited disclosure and its advantages and features can be obtained, a more particular description of the principles described above will be rendered by reference to specific examples illustrated in the appended drawings. These drawings depict only example aspects of the disclosure, and are therefore not to be considered as limiting of its scope. These principles are described and explained with additional specificity and detail through the use of the following drawings.

DETAILED DESCRIPTION

The present invention is described with reference to the attached figures, where like reference numerals are used throughout the figures to designate similar or equivalent elements. The figures are not drawn to scale, and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

In view of the foregoing, embodiments disclosed herein are directed to GPU systems that include a PCIe board configured to be selectively positioned in a first position or a second position. This type of PCIe board allows for the installation of GPU modules, such that any GPU fans in these GPU modules can be arranged to provide airflow in the same direction as the direction required for the electronics rack the GPU system in installed in. This is discussed in greater detail with respect to FIGS. 2A, 2B, 3A and 3B.

Figure 2A:
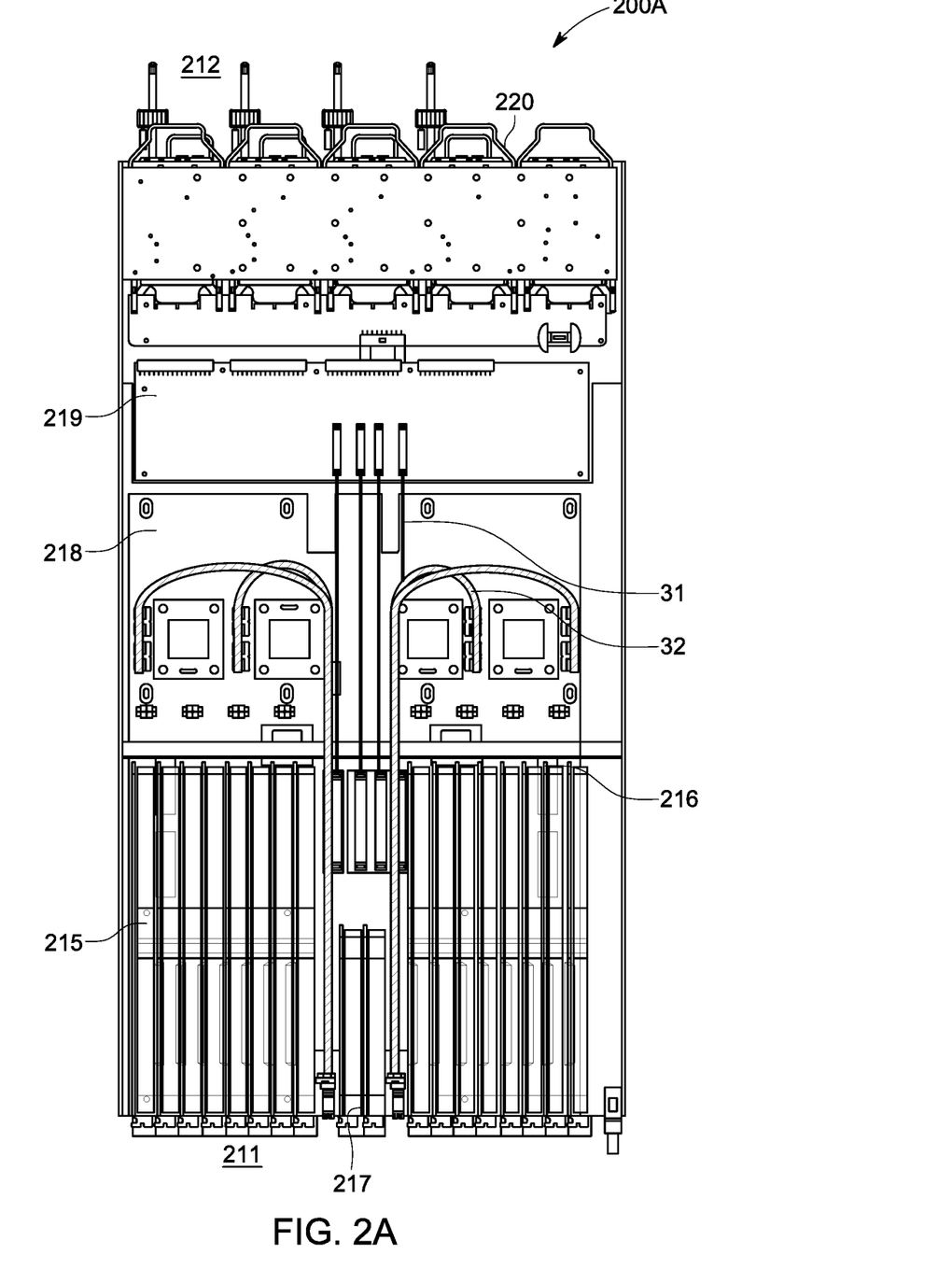
FIG. 2A is a top-down view of a server GPU system, according to one or more embodiments of the disclosure.

FIG. 2A is a top-down view of a server GPU system 200A, in accordance with an embodiment of the disclosure. The server GPU system 200A can have a front side 211 and a rear side 212. The server GPU system 200A can include a first set of GPU modules 215 and a second set of GPU modules 216. In the server GPU system 200A, the first and second sets of GPU modules 215 and 216 are illustrated as being separated by PCIe slots 217. The server GPU system 200A can also include fan modules 220 located opposite the first and second GPU modules 215 and 216. The server GPU system 200A can also have a PCIe baseboard 218 and PDB 219.

As noted above, the PCIe baseboard 218 can be installed in first and second positions. The first position in shown in FIG. 2A. To support the multiple positions, the PCIe baseboard 218 and PDB 219 are connected using a cable methodology rather than using board-to-board connections. Therefore, as shown in FIG. 2A, the server GPU system 200A includes power cable connectors 31 connecting the PDB 219 with the fan modules 220, the first and second sets of GPU modules 215 and 216, and the PCIe slots 217. Each GPU module of the first and second sets of GPU modules 215 and 216 can be installed directly into the PCIe baseboard 218. The PCIe slots 217 can also be connected to the PCIe baseboard 218 to facilitate connection between the received network cards and other server devices (not shown).

Figure 2B:
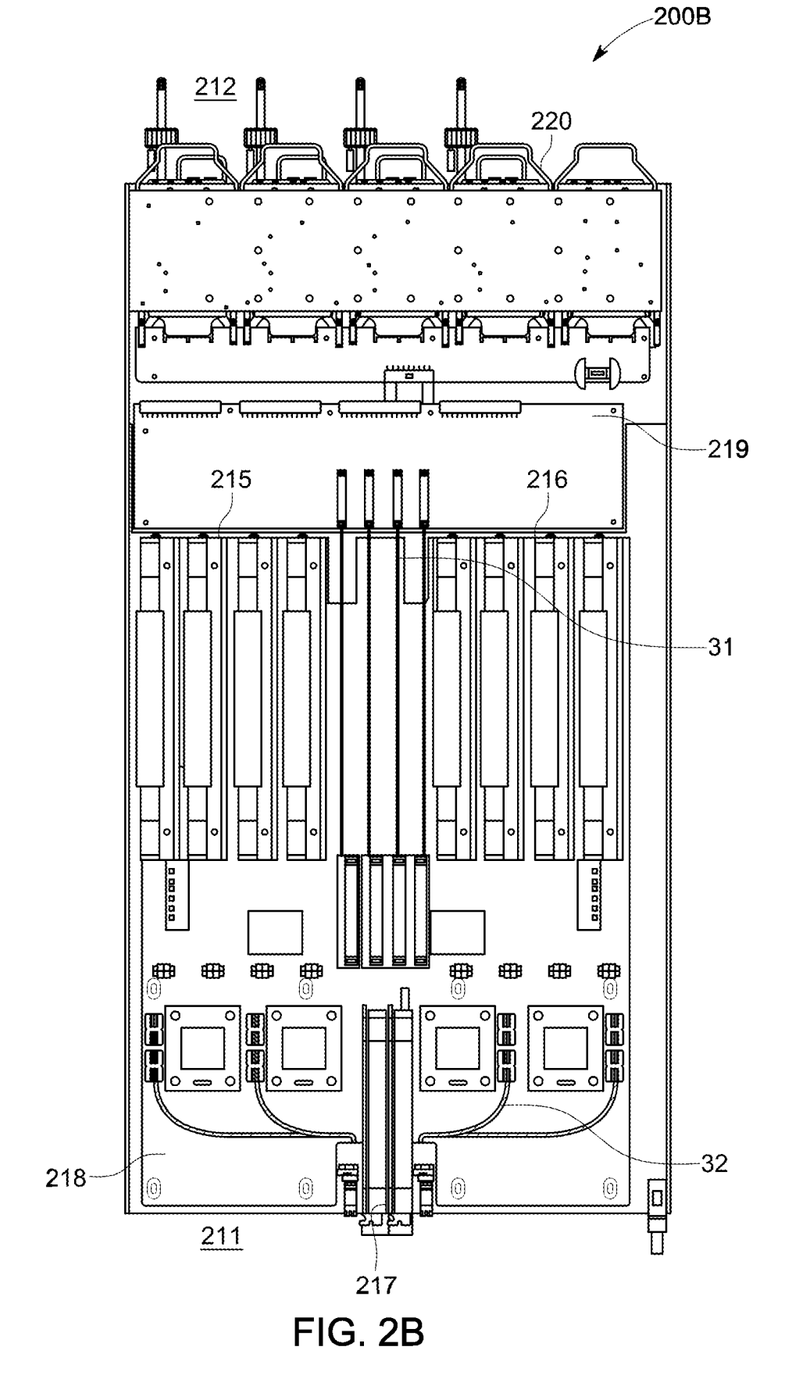
FIG. 2B is a top-down view of a desktop GPU system, according to one or more embodiments of the disclosure.

FIG. 2B is a top-down view of a desktop GPU system 200B, in accordance with an embodiment of the disclosure. For any components in FIG. 2B having the same reference numeral as in FIG. 2A, the description in FIG. 2A is sufficient for describing these components in FIG. 2B unless otherwise indicated below. In desktop GPU system 200B, the PCIe baseboard 218 is provided in a second position, i.e., rotated 180 degrees relative to its position in FIG. 2A. Thus, the PCIe baseboard 218 includes a printed circuit board (PCB) (not shown) design to support use thereof in the first or second positions.

The server GPU system 200A will keep the original GPU placement of the conventional GPU system 10. That is, the first and second sets of GPU modules 215 and 216 will still be accessible at the front side 211. In contrast, the rotation of the PCIe baseboard 218 will relocate the slots for the first and second sets of GPU modules 15 and 16 near the PDB 219.

In some embodiments, the board-to-board connector can include a P12V power connector and a sideband signal connector. In other embodiments, the PDB 219 and the PCIe baseboard 218 can be connected using a cable meth to allow for design flexibility.

The server GPU system 200A and the desktop GPU system 200B can route the power cable connectors 31 in the center of the PCIe baseboard 218 to the center of the PDB 219. By routing the power cable connectors 31 in the center of the PCIe baseboard 218, the power cable connectors 31 are easier to service. Furthermore, routing the power cable connectors 31 in the center of the PCIe baseboard 218 improves the performance of the plurality of fan modules 220, but it may overlap with other PCIe signal cables 32. If the cable is routed outside the center of the PCIe baseboard 218, the cable can block air flow.

Other configurations can include the power cable connectors 31 being routed along the edges of the PCIe baseboard 218 to the edges of the PDB 219. These embodiments are discussed in greater detail with respect to FIGS. 3A and 3B.

Figure 3A:
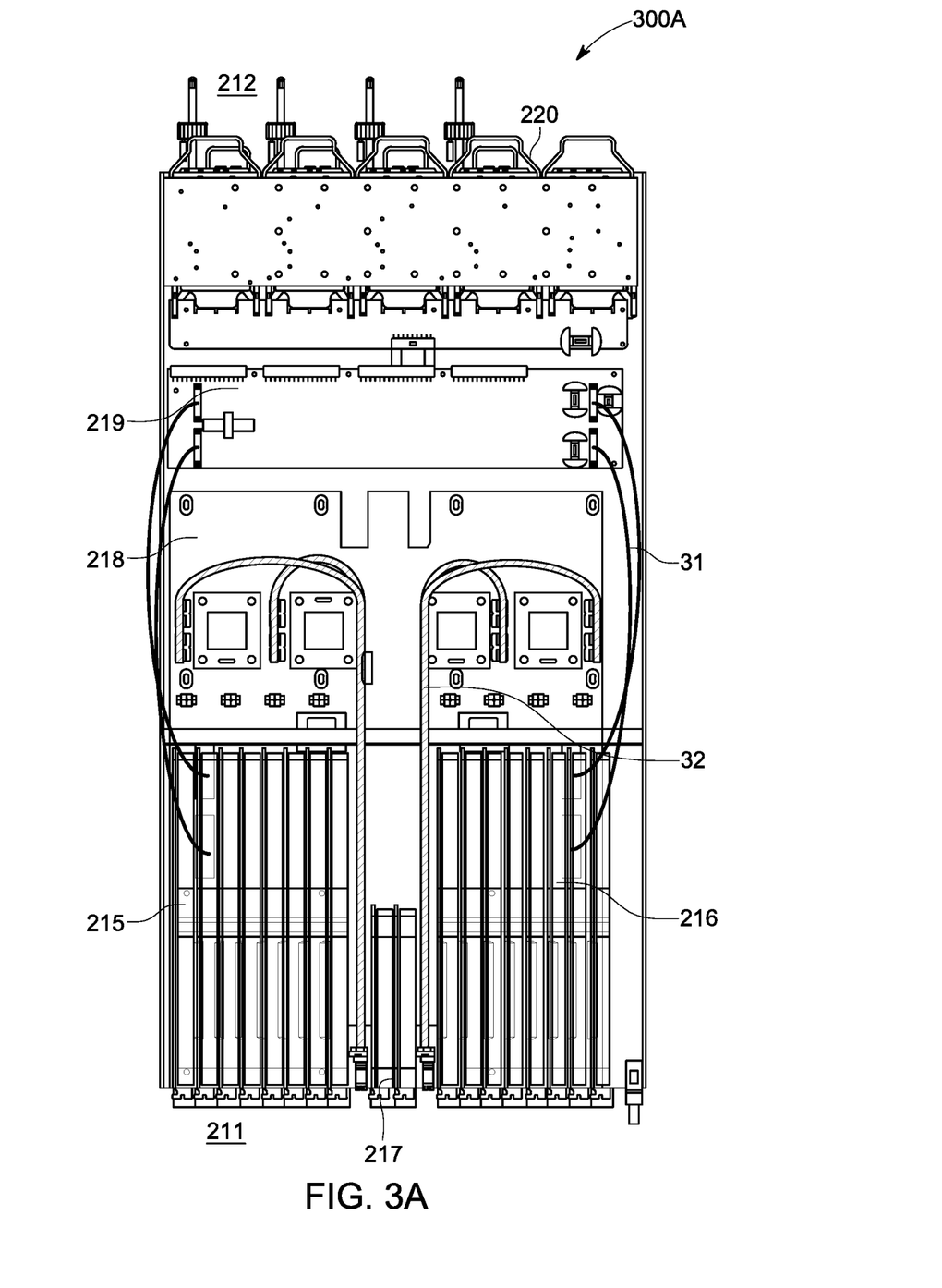
FIG. 3A is a top-down view of a server GPU system, according to one or more embodiments of the disclosure.
Figure 3B:
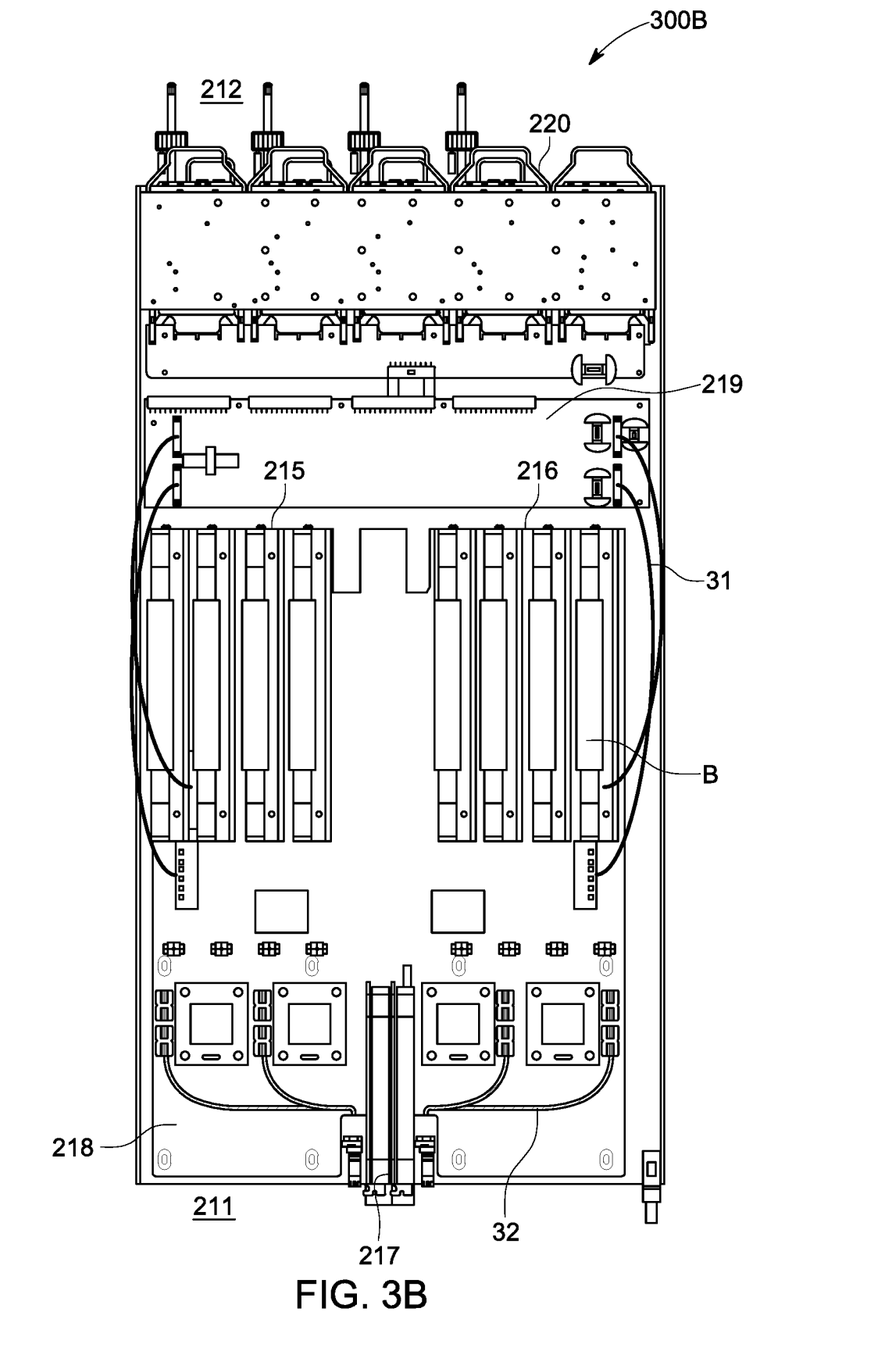
FIG. 3B is a top-down view of a desktop GPU system, according to one or more embodiments of the disclosure.

FIG. 3A is a top-down view of a server GPU system 300A, in accordance with an embodiment of the disclosure. The server GPU system 300A is the same as the GPU system 200A except for alternative routing. FIG. 3B is a top-down view of a desktop GPU system 300B, in accordance with an embodiment of the disclosure. The desktop GPU system 300B is the same as the desktop GPU system 200B except alternative routing. For any components in FIGS. 3A and 3B having the same reference numeral as in FIG. 2A, the description in FIG. 2A is sufficient for describing these components in FIGS. 3A and 3B unless otherwise indicated below. The server GPU system 300A and the desktop GPU system 300B route the power cable connectors 31 along the edges of the PCIe baseboard 218 to the edges of the PDB 219. By routing the power cable connectors 31 along the edges of the PCIe baseboard 218 to the edges of the PDB 219, the power cable connectors 31 can be separate from the PCIe signal cables 32. However, the routing of the power cable connectors 31 along the edges of the PCIe baseboard 218 to the edges of the PDB 219 may negatively impact the performance of the fan modules 220. Furthermore, routing the power cable connectors 31 along the edges of the PCIe baseboard 218 to the edges of the PDB 219 may make it difficult to service the cables since will be little space to uninstall the cables in order to service them. By routing the power cable connectors 31 along the edges of the PCIe baseboard 218, more space is provided to place more components within the center of the PCIe baseboard 218.

In both the server GPU system 300A and the desktop GPU system 300B, the PCIe slots 217 are placed at the front side 211 (I/O side). However, the PCIe switch (not shown) has only one downstream port to connect to the PCIe slots 217. Because the PCIe switch has a limited PCIe lane, rotating the PCIe prevents the connection of the PCIe lane from the PCIe switch and the PCIe slot. To solve this issue, some embodiments of the disclosure implement an adaptor to switch between the different PCIe slots 217. Specifically, a MUX switch can be implemented to switch to the different PCIe slots 217. This is discussed in more detail with respect to FIG. 5. In alternative embodiments, a switched-capacitor resistor circuit can be connected to the PCIe slots 217. This is discussed in more detail with respect to FIG. 6. In additional alternative embodiments, a series of SlimSAS connectors can be implemented at the PCIe switches and the PCIe slots 217. This is discussed in more detail with respect to FIG. 7. In each of the embodiments discussed herein, space for the PCIe slots 217 is reserved at the front side 211.

Figure 4:
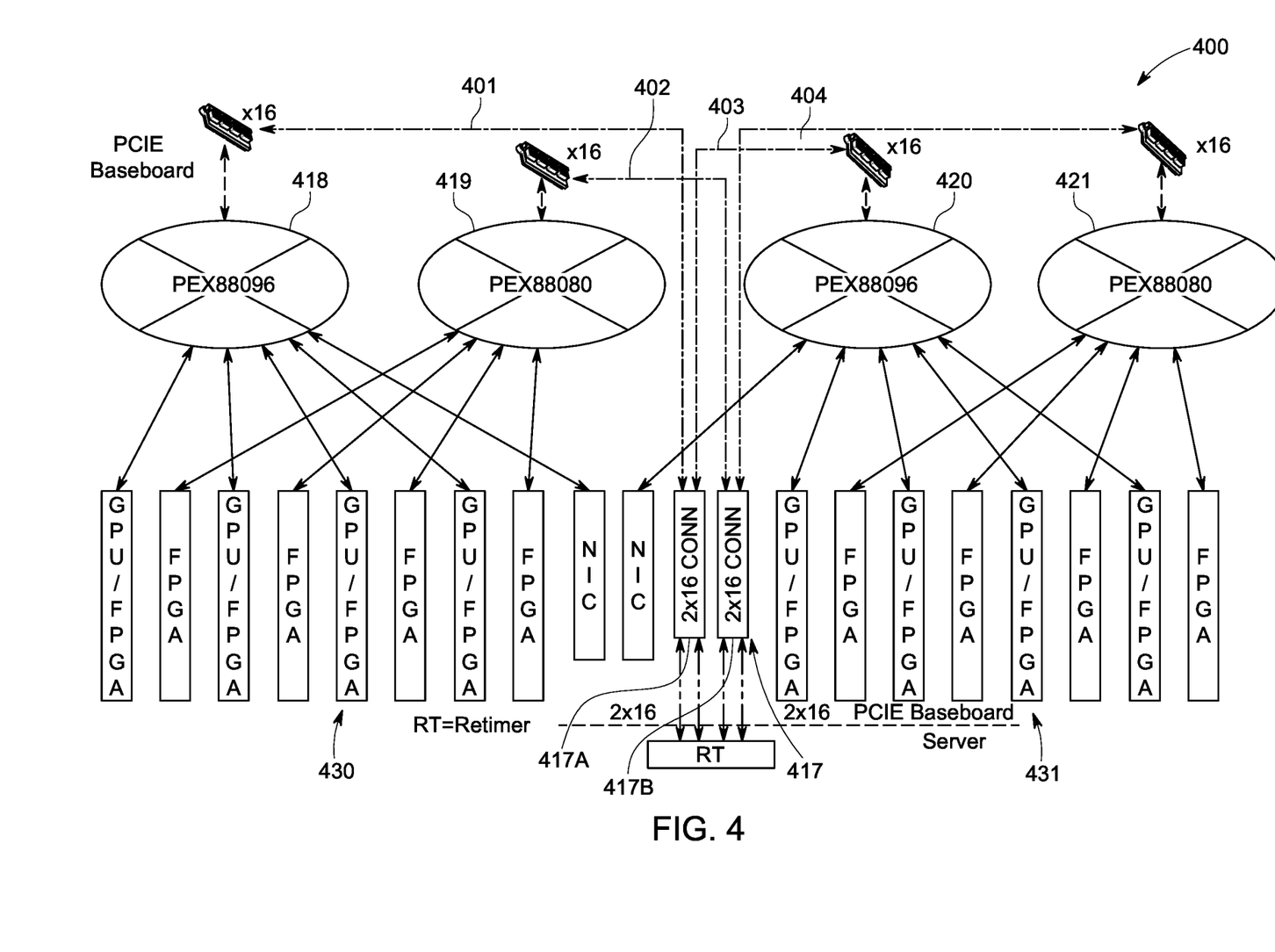
FIG. 4 illustrates a PCIe topology of the GPU system, according to one or more embodiments of the disclosure.

FIG. 4 illustrates a PCIe topology 400 of the GPU system, according to one or more embodiments of the disclosure. The PCIe topology 400 includes the PCIe slots 417 connected to a series of PCIe switches 418, 419, 420, and 421. The PCIe slots 417 can include a left PCIe slot 417A and a right PCIe slot 417B. The left PCIe slot 417A can be connected to the PCIe switch 418 by a PCIe internal cable 401. The left PCIe slot 417A can also be connected to the PCIe switch 420 by a PCIe internal cable 403. The right PCIe slot 417B can be connected to the PCIe switch 419 by the PCIe internal cable 402. The right PCIe slot 417B can also be connected to the PCIe switch 421 by the PCIe internal cable 404.

Figure 5:
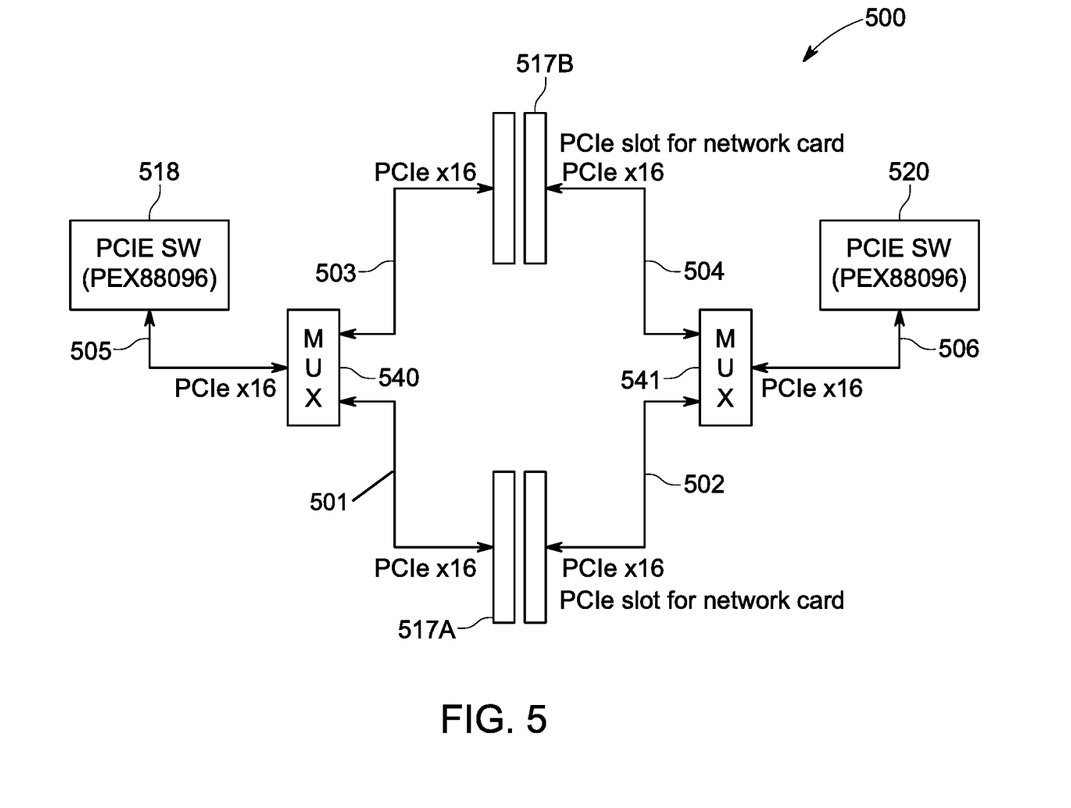
FIG. 5 illustrates a first alternative PCIe topology of the GPU system, according to one or more embodiments of the disclosure.
Figure 6:
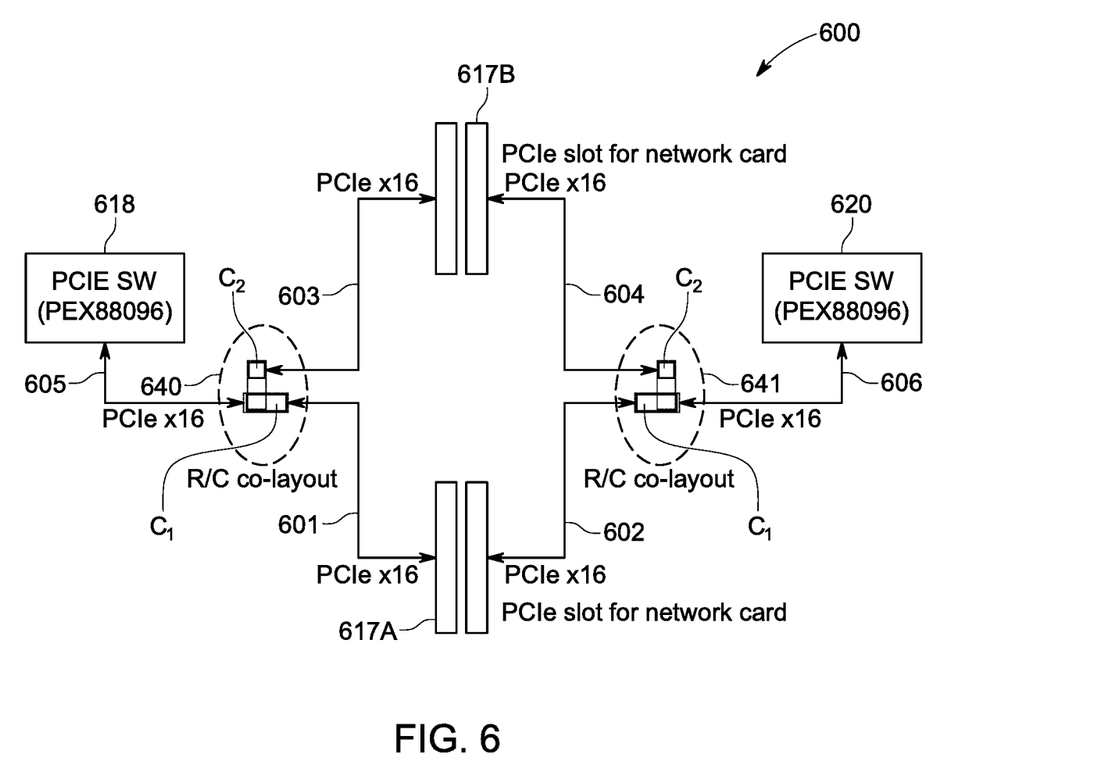
FIG. 6 illustrates a second alternative PCIe topology of the GPU system, according to one or more embodiments of the disclosure.
Figure 7:
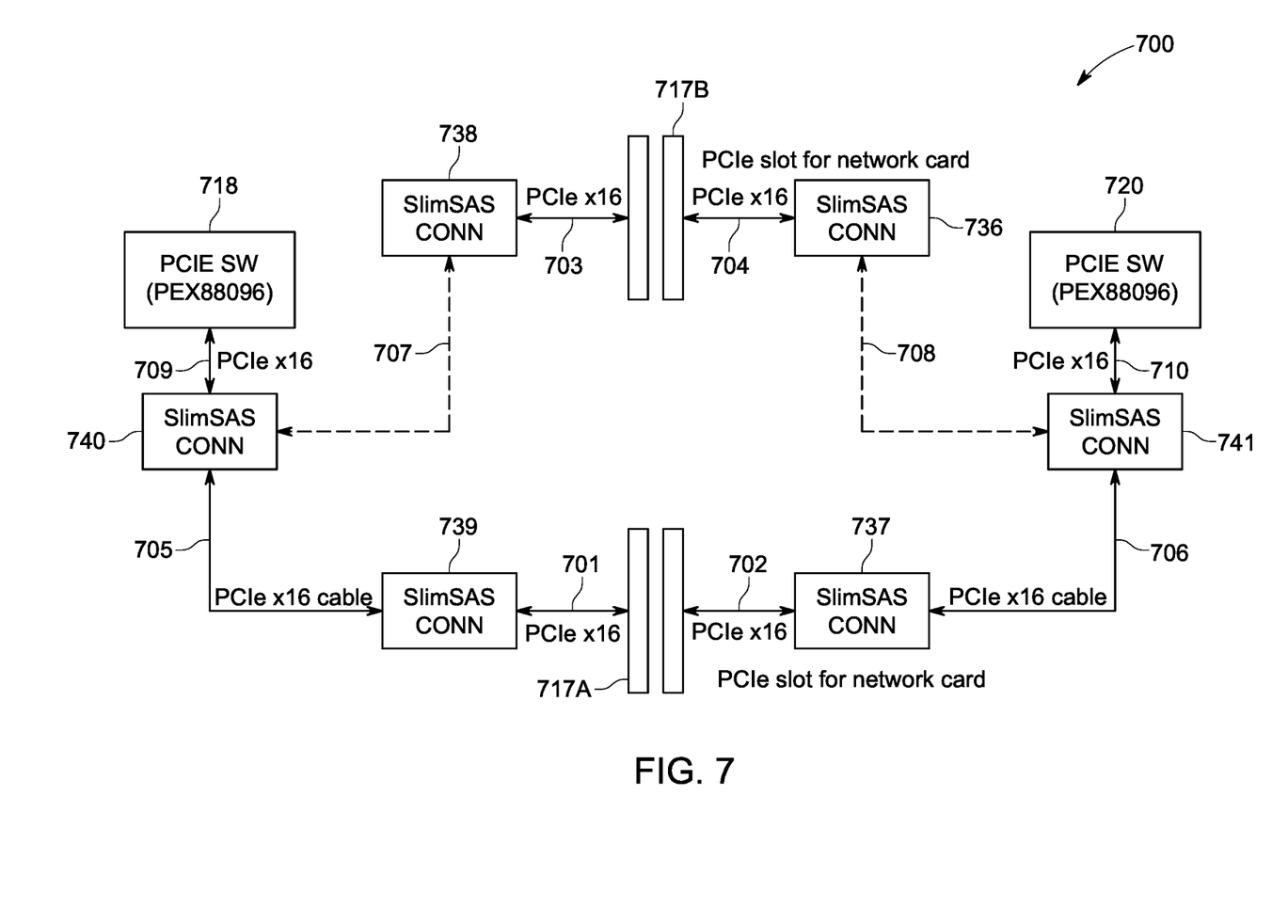
FIG. 7 illustrates a third alternative PCIe topology of the GPU system, according to one or more embodiments of the disclosure.

The series of PCIe switches 418, 419, 420, and 421 enable the PCIe slots 417 to communicate with the first set of I/O ports 430 and the second set of I/O ports 431. The first set of I/O ports are connected to the PCIe switches 418 and 419. The second set of I/O ports are connected to the PCIe switches 420 and 421. The PCIe switches facilitates the electrical connection between the PCIe slots 417 and the first and second set of I/O ports 430 and 431. The first and second set of I/O ports 430 and 431 can include field-programmable gate array (FPGA) ports for small (NIC) and large (GPU) physical card types. Because the PCIe slots 417 are directly connected to the series of PCIe switches 418, 419, 420, and 421 in an upstream manner, the PCIe slots 417 cannot be placed at the I/O side of the GPU system. FIGS. 5-7 detail alternative topologies to be implemented in an embodiment of the present disclosure.

FIG. 5 illustrates a first alternative PCIe topology 500 of the GPU system, according to one or more embodiments of the disclosure. The PCIe topology 500 includes a first PCIe slot 517A and a second PCIe slot 517B both connected to a series of PCIe switches 518 and 520 implementing multiplexers (MUX). The first and second PCIe slots 517A and 517B can be connected to the PCIe switch 518 via a first MUX 540. Specifically, the first PCIe slot 517A can be connected to the first MUX 540 by a PCIe trace on board 501. Similarly, the second PCIe slot 517B can be connected to the first MUX 540 by a PCIe trace on board 503. The first MUX 540 can connect both the first and second PCIe slots 517A and 517B to the PCIe switch 518 by a PCIe trace on board 505.

Similarly, the first and second PCIe slots 517A and 517B can be connected to the PCIe switch 520 via a second MUX 541. Specifically, the first PCIe slot 517A can be connected to the second MUX 541 by a PCIe trace on board 502. Similarly, the second PCIe slot 517B can be connected to the second MUX 541 by a PCIe trace on board 504. The second MUX 541 can connect both the first and second PCIe slots 517A and 517B to the PCIe switch 520 by a PCIe trace on board 506. The PCIe topology 500 economizes the connections between the first and second PCIe slots 517A and 517B to each of the PCIe switches 518 and 520 over a single channel, by connecting the multiplexer's single output to the demultiplexer's single input (neither shown).

FIG. 6 illustrates a second alternative PCIe topology 600 of the GPU system, according to one or more embodiments of the disclosure. The PCIe topology 600 implements multiple switched-capacitor resistor circuits. The switched-capacitor resistor circuit is an electronic circuit element used for discrete-time signal processing. The switched-capacitor resistor circuit works by moving charges into and out of capacitors when switches are opened and closed. In the present embodiment, non-overlapping signals are used to control the switches, so that not all switches are closed simultaneously.

The PCIe topology 600 includes a first PCIe slot 617A and a second PCIe slot 617B, both connected to a series of PCIe switches 618 and 620 implementing switched-capacitor resistor circuits. The first and second PCIe slots 617A and 617B can be connected to the PCIe switch 618 via a first switched-capacitor resistor circuit 640. Specifically, the first PCIe slot 617A can be connected to the first switched-capacitor resistor circuit 640 by a PCIe trace on board 601. Similarly, the second PCIe slot 617B can be connected to the first switched-capacitor resistor circuit 640 by a PCIe trace on board 603. The first switched-capacitor resistor circuit 640 can connect both the first and second PCIe slots 617A and 617B to the PCIe switch 618 by a PCIe trace on board 605. The first switched-capacitor resistor circuit 640 can be made up of one a first capacitor $C_1$ and a second capacitor $C_2$, which are overlapped to alternate the input and output of the first switched-capacitor resistor circuit 640.

Similarly, the first and second PCIe slots 617A and 617B can be connected to the PCIe switch 620 via a second switched-capacitor resistor circuit 641. Specifically, the first PCIe slot 617A can be connected to the second switched-capacitor resistor circuit 641 by a PCIe trace on board 602. Similarly, the second PCIe slot 617B can be connected to the second switched-capacitor resistor circuit 641 by a PCIe trace on board 604. The second switched-capacitor resistor circuit 641 can connect both the first and second PCIe slots 617A and 617B to the PCIe switch 620 by a PCIe trace on board 606. The second switched-capacitor resistor circuit 641 can be made up of a first capacitor $C_1$ and a second capacitor $C_2$, which are overlapped to alternate the input and output of the first switched-capacitor resistor circuit 640.

FIG. 7 illustrates a third alternative PCIe topology 700 of the GPU system, according to one or more embodiments of the disclosure. The PCIe topology 700 implements multiple high speed connectors. In some embodiments, the high-speed connectors can be SlimSAS connectors. The high-speed connectors enable designers to achieve high port density, configurability, and utilization. Their design provides mechanical durability and resonance dampening features. The SlimSAS connectors can be connected by Slim-SAS cables, which are configured to address various interconnect issues such as bulk cable form factor restrictions.

The PCIe topology 700 includes a first PCIe slot 717A and a second PCIe slot 717B, both connected to a series of PCIe switches 718 and 720 implementing high-speed connectors such as SlimSAS connectors. The first and second PCIe slots 717A and 717B can be connected to the PCIe switch 718 via a first switch-SlimSAS connector 740. Specifically, the first PCIe slot 717A can be connected to a first SlimSAS connector 739 by a PCIe trace on board 701. The first SlimSAS connector 739 and the first switch-SlimSAS connector 740 can be connected by a high-speed cable 705. In some embodiments, the high-speed cable 705 can be a SlimSAS cable.

Similarly, the second PCIe slot 717B can be connected to a second SlimSAS connector 738 by a PCIe trace on board 703. The second SlimSAS connector 738 and the first switch-SlimSAS connector 740 can be connected by a high-speed cable 707. In some embodiments, the high-speed cable 707 can be a SlimSAS cable. The first switch-Slim-SAS connector 740 can be connected to the PCIe switch 718 by a PCIe trace on board 709. In other words, the first PCIe slot 717A and a second PCIe slot 717B can both connected to the PCIe switch 718 via the series of SlimSAS connectors.

The first and second PCIe slots 717A and 717B can be connected to the PCIe switch 720 via a second switch-SlimSAS connector 741. Specifically, the first PCIe slot 717A can be connected to a third SlimSAS connector 737 by a PCIe trace on board 702. The third SlimSAS connector 737 and the second switch-SlimSAS connector 741 can be connected by a high-speed cable 706. In some embodiments, the high-speed cable 706 can be a SlimSAS cable.

Similarly, the second PCIe slot 717B can be connected to a fourth SlimSAS connector 736 by a PCIe trace on board 704. The fourth SlimSAS connector 736 and the second switch-SlimSAS connector 741 can be connected by a high-speed cable 708. In some embodiments, the high-speed cable 708 can be a SlimSAS cable. The second switch-SlimSAS connector 741 can be connected to the PCIe switch 720 by a PCIe trace on board 710. In other words, the first PCIe slot 717A and a second PCIe slot 717B can both connected to the PCIe switch 720 via the series of SlimSAS connectors. The series of SlimSAS connectors and associated SlimSAS cables can enable switching between the first and second PCIe slots 717A and 717B and the PCIe switches 718 and 720.

Referring momentarily back to FIGS. 2A and 2B, the length of the PCIe signal cables 32 will vary in the server GPU system 200A and the desktop GPU system 200B embodiments. Upon rotating the PCIe baseboard 218 to create the desktop GPU system 200B, the length of the PCIe signal cables 32 is shortened, thereby improving the signal integrity. In the embodiment of PCIe topology 700, the PCIe signal cables 32 can be miniSAS cables. Rotating the PCIe baseboard 218 to create the desktop GPU system 200B can require various mechanical embodiments of the server GPU system 200A. This is discussed in greater detail below with respect to FIGS. 8A, 8B, 8C, 9A, and 9B.

Figure 8:
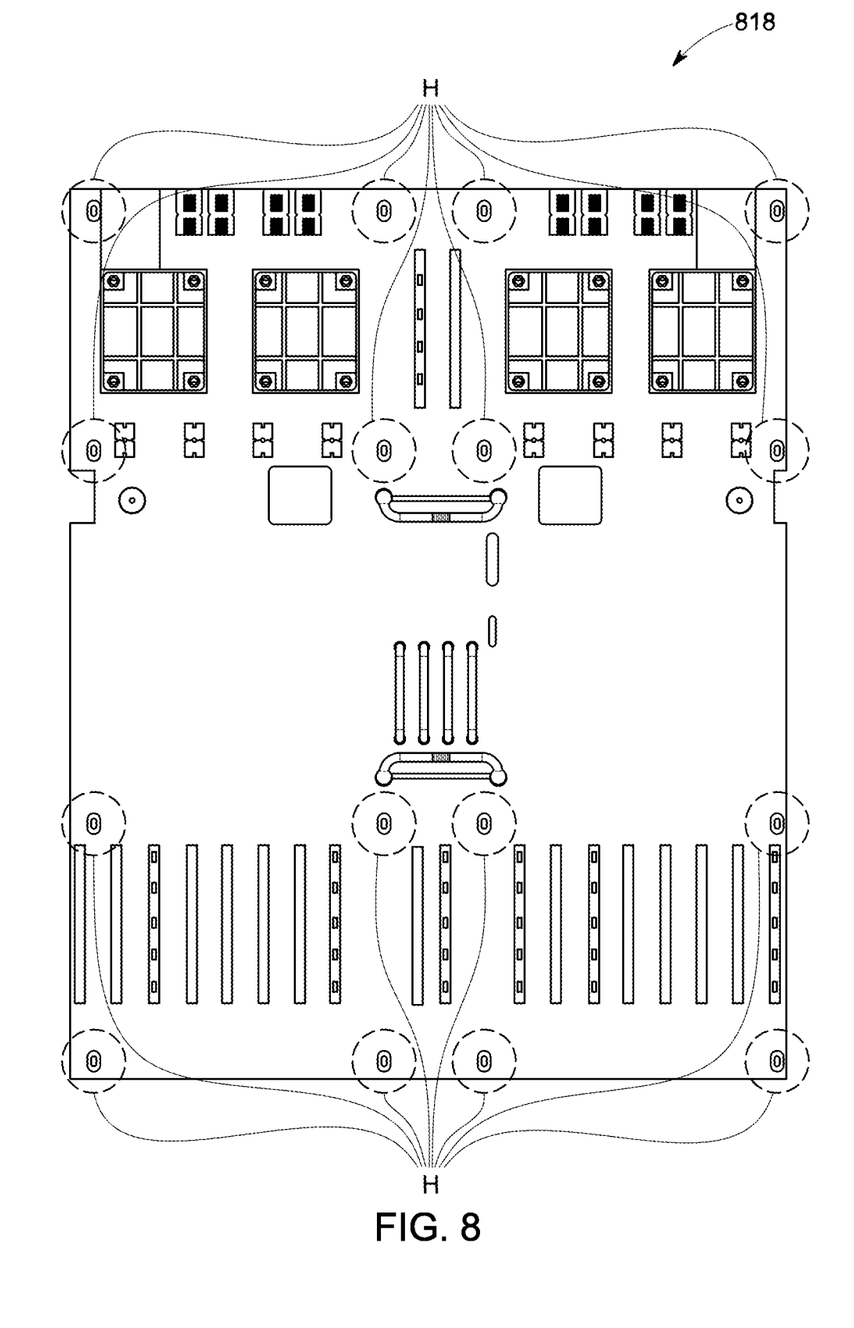
FIG. 8 is a top-down view of the PCIe baseboard, in accordance with an embodiment of the disclosure.

FIG. 8 is a top-down view of the PCIe baseboard 818 implemented in the desktop GPU system 300B and the server GPU system 300A. The screw mounting holes H can be located at different locations on the PCIe baseboard 818 to create a symmetrical layout. The screw mounting holes H can assist the rotation and placement of the PCIe baseboard 818. In addition to screw mounting holes H, bracket assemblies also facilitate the 180-degree rotation of the PCIe baseboard 818. This is discussed in more detail with respect to FIGS. 9A and 9B.

Figure 9A:
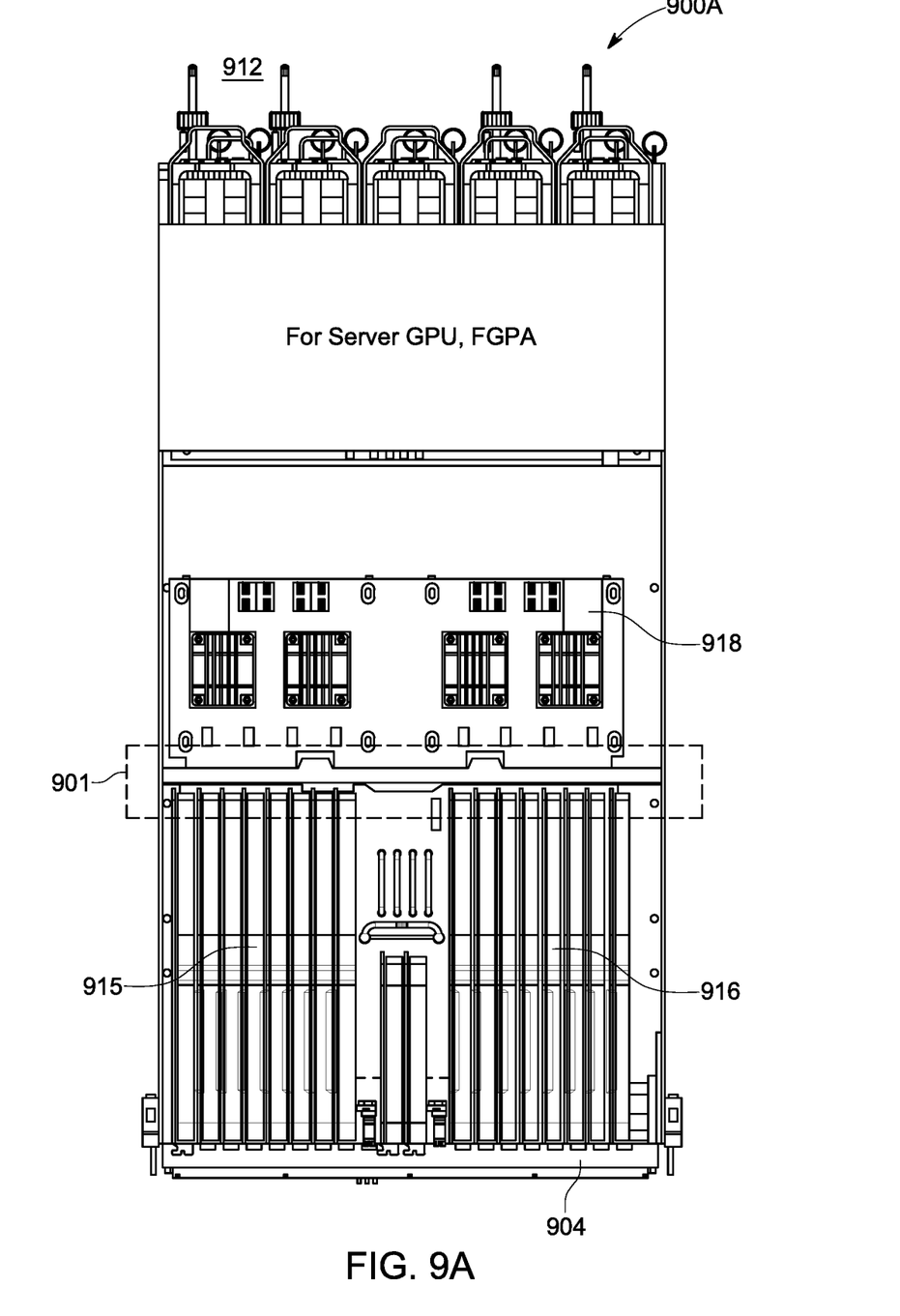
FIG. 9A is a top-down view of a server GPU system 900A, in accordance with an embodiment of the disclosure.
Figure 9B:
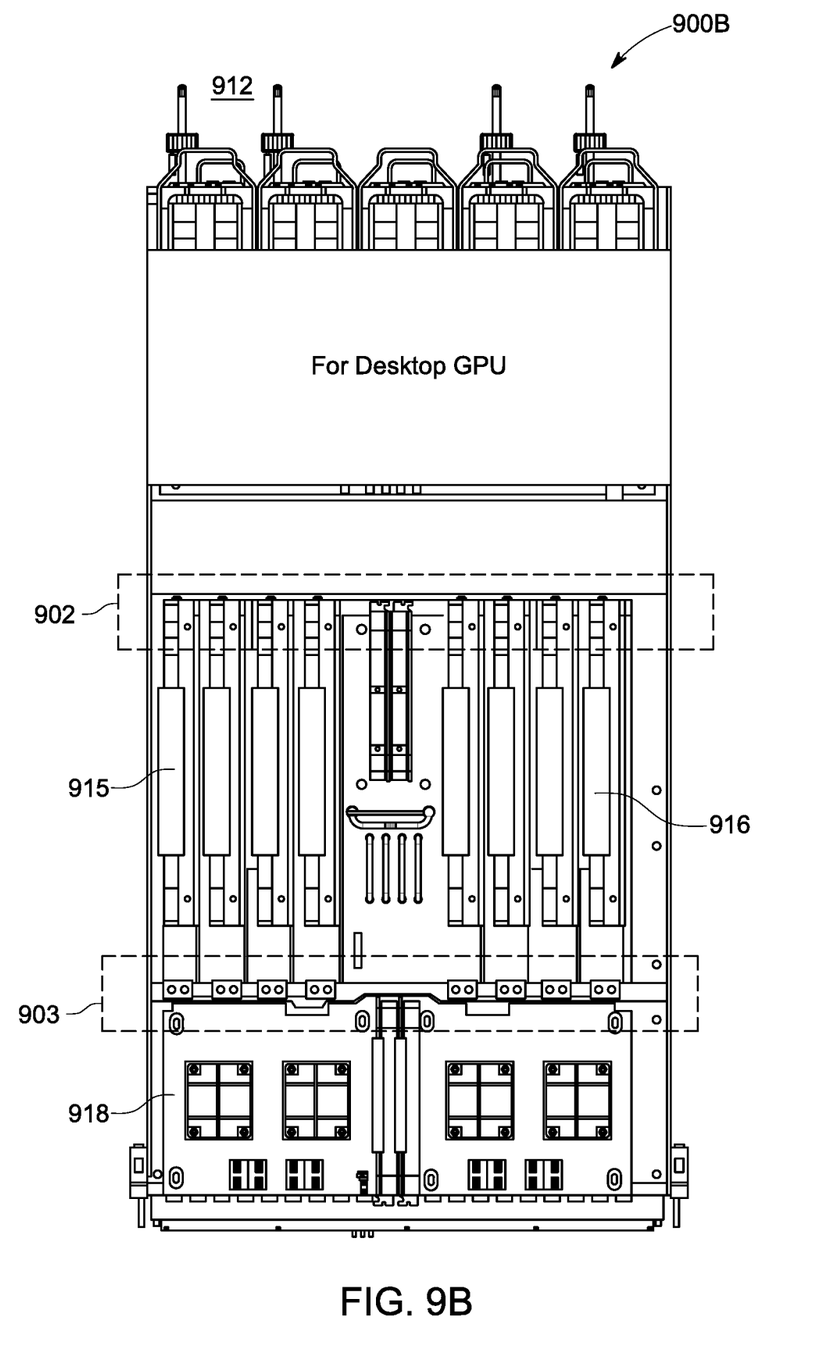
FIG. 9B is a top-down view of a desktop GPU system 900B, in accordance with an embodiment of the disclosure.

FIG. 9A and FIG. 9B are perspective views of a server GPU system 900A and a desktop GPU system 900B, respectively, in accordance with an embodiment of the disclosure. The server GPU system 900A includes a first GPU bracket 901 and a second GPU bracket 904. Each GPU card can be fixed by two brackets in its rear and front side for stability. For example, the GPU brackets 901 and 904 can be implemented to ensure the GPU card is secured within the GPU system 900A. In comparison, the desktop GPU system 900B includes a first GPU bracket 902 and a second GPU bracket 903. In the process of rotating the PCIe baseboard 918, the first and second plurality of GPU modules 915 and 916 are rotated towards the rear side 912 of the desktop GPU system 900B. The first GPU bracket 902 is implemented to separate the PCIe baseboard 918 from the PDB (not shown) that would be positioned just above the PCIe baseboard 918. The desktop GPU modules are fixed by bracket 902 and bracket 903 of 900B system where the PCIe baseboard 918 is reversed. In some embodiments of the GPU system 900B, the GPU bracket 904 of GPU system 900A is still implemented although it is no longer supporting the GPU modules.

While particular embodiments of the present invention have been shown and described, it will be obvious to those skilled in the relevant arts that changes and modifications may be made without departing from the invention in its broader aspects. Therefore, the aim in the appended claims is to cover all such changes and modifications that fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

The terminology used herein is for the purpose of describing particular embodiments only and is not intended to limit the invention. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A computing device, comprising:
   a chassis with a first end and a second end;
   a plurality of fan modules located at the first end of the chassis;
   a Peripheral Component Interconnect Express (PCIe) baseboard located at a front side of the chassis, the PCIe baseboard configured to support placement thereof in the chassis in a first position and a second position, the PCIe baseboard comprising a plurality of graphic processing unit (GPU) slots for installing a plurality of GPUs, each of the plurality of GPUs comprising a GPU fan module; and
   at least two PCIe slots and at least one PCIe switch, wherein the at least two PCIe slots are connected to the at least one PCIe switch via a MUX switch, a switched-capacitor resistor circuit, a SlimSAS connector, or any combination thereof,
   wherein the second position of the PCIe baseboard is a 180-degree rotation from the first position.

2. The computing device of claim 1, further comprising a power distribution board (PDB) housed between the plurality of fan modules and the PCIe baseboard.

3. The computing device of claim 2, wherein the at least one PCIe slot or an additional PCIe slot separates a first GPU and a second GPU of the plurality of GPUs.

4. The computing device of claim 3, further comprising power cable connectors connecting the PDB with the plurality of fan modules, the plurality of GPUs, and the at least one PCIe slot.

5. The computing device of claim 4, wherein the power cable connectors can be routed towards a center line of the PCIe baseboard or along outer edges of the PCIe baseboard.

6. The computing device of claim 3, further comprising PCIe signal cables connecting the at least one PCIe slot to the at least one PCIe switch.

7. The computing device of claim 6, wherein the PCIe signal cables are shorter in the second position of the PCIe baseboard than in the first position of the PCIe baseboard.

8. The computing device of claim 1, wherein the first position of the PCIe baseboard is a server GPU configuration, wherein the at least one PCIe switch is located between the first and second plurality of graphic processing units and the plurality of fan modules.

9. The computing device of claim 1, wherein the second position of the PCIe baseboard is a desktop GPU configuration, wherein the at least one PCIe switch is located at the front side of the chassis.

10. The computing device of claim 1, wherein the PCIe baseboard comprises a plurality of screw mounting holes symmetrically positioned on the PCIe baseboard to enable a transition between the first position and the second position.

11. A Peripheral Component Interconnect Express (PCIe) baseboard located at a front side of a chassis, the PCIe baseboard configured to support placement thereof in the chassis in a first position and a second position, the second position of the PCIe baseboard being a 180-degree rotation from the first position, and wherein the PCIe baseboard comprises:
   a plurality of graphic processing unit (GPU) slots for installing a plurality of GPUs, each of the plurality of GPUs comprising a GPU fan module; and
   at least one PCIe slot and at least one PCIe switch, the at least one of PCIe slot being connected to the at least one PCIe switch via a MUX switch, a switched-capacitor resistor circuit, a SlimSAS connector, or any combination thereof.

12. The PCIe baseboard of claim 11, wherein the at least one PCIe slot or an additional PCIe slot separates a first GPU and a second GPU of the plurality of GPUs.

13. The PCIe baseboard of claim 12, further comprising PCIe signal cables connecting the at least one PCIe slot to the at least one PCIe switch.

14. The PCIe baseboard of claim 13, wherein the PCIe signal cables are shorter in the second position of the PCIe baseboard than the first position of the PCIe baseboard.

15. The PCIe baseboard of claim 11, wherein the first position of the PCIe baseboard is a server GPU configuration, wherein the at least one PCIe switch is located between the plurality of GPUs and a plurality of fan modules located at a rear side of the chassis.

16. The PCIe baseboard of claim 11, wherein the second position of the PCIe baseboard is a desktop GPU configuration, wherein the at least one PCIe switch is located at the front side of the chassis.

17. The PCIe baseboard of claim 11, further comprising a plurality of screw mounting holes symmetrically positioned on the PCIe baseboard to enable a transition between the first position and the second position.

18. A computing device, comprising:
   a chassis with a first end and a second end;
   a plurality of fan modules located at the first end of the chassis;
   a Peripheral Component Interconnect Express (PCIe) baseboard located at a front side of the chassis, the PCIe baseboard configured to support placement thereof in the chassis in a first position and a second position, the PCIe baseboard comprising a plurality of graphic processing unit (GPU) slots for installing a plurality of GPUs, each of the plurality of GPUs comprising a GPU fan module, the PCIe baseboard further comprising at least one PCIe slot separating a first GPU and a second GPU of the plurality of GPUs, the at least one PCIe slot being connected to at least one PCIe switch;
   a power distribution board (PDB) housed between the plurality of fan modules and the PCIe baseboard; and
   one or more power cable connectors connecting the PDB with the plurality of fan modules, the plurality of GPUs, and the at least one PCIe slot;
   wherein the second position of the PCIe baseboard is a 180-degree rotation from the first position.

19. A computing device, comprising:
   a chassis with a first end and a second end;
   a plurality of fan modules located at the first end of the chassis; and
   a Peripheral Component Interconnect Express (PCIe) baseboard located at a front side of the chassis, the PCIe baseboard configured to support placement thereof in the chassis in a first position and a second position, the PCIe baseboard comprising a plurality of graphic processing unit (GPU) slots for installing a plurality of GPUs, each of the plurality of GPUs comprising a GPU fan module, the PCIe baseboard further comprising at least one PCIe slot separating a first GPU and a second GPU of the plurality of GPUs, the at least one PCIe slot or an additional PCIe slot being connected to at least one PCIe switch;
   a power distribution board (PDB) housed between the plurality of fan modules and the PCIe baseboard; and
   one or more PCIe signal cables connecting the at least one PCIe slot to the at least one PCIe switch, the one or more PCIe signal cables being shorter in the second position of the PCIe baseboard than in the first position of the PCIe baseboard,
wherein the second position of the PCIe baseboard is a 180-degree rotation from the first position.

20. A Peripheral Component Interconnect Express (PCIe) baseboard located at a front side of a chassis, the PCIe baseboard configured to support placement thereof in the chassis in a first position and a second position, wherein the second position of the PCIe baseboard is a 180-degree rotation from the first position, and wherein the PCIe baseboard comprises:
 a plurality of graphic processing unit (GPU) slots for installing a plurality of GPUs, each of the plurality of GPUs comprising a GPU fan module;
 at least one PCIe slot separating a first GPU and a second GPU of the plurality of GPUs, the at least one PCIe slot or an additional PCIe slot being connected to at least one PCIe switch; and
 one or more PCIe signal cables connecting the at least one PCIe slot to the at least one PCIe switch, the one or more PCIe signal cables being shorter in the second position of the PCIe baseboard than in the first position of the PCIe baseboard.

21. A Peripheral Component Interconnect Express (PCIe) baseboard located at a front side of a chassis, the PCIe baseboard configured to support placement thereof in the chassis in a first position and a second position, the second position of the PCIe baseboard being a 180-degree rotation from the first position, and wherein the PCIe baseboard comprises:
 a plurality of graphic processing unit (GPU) slots for installing a plurality of GPUs, each of the plurality of GPUs comprising a GPU fan module; and
 a plurality of screw mounting holes symmetrically positioned on the PCIe baseboard to enable a transition between the first position and the second position.

\* \* \* \* \*